(12) United States Patent
Muramatsu et al.

(10) Patent No.: US 8,771,618 B2
(45) Date of Patent: Jul. 8, 2014

(54) METHOD FOR PRODUCING ALKALI METAL NIOBATE PARTICLES, AND ALKALI METAL NIOBATE PARTICLES

(75) Inventors: Atsushi Muramatsu, Sendai (JP); Kiyoshi Kanie, Sendai (JP); Atsuki Terabe, Iwaki (JP); Yasuhiro Okamoto, Iwaki (JP); Hideto Mizutani, Iwaki (JP); Satoru Sueda, Iwaki (JP); Hirofumi Takahashi, Fuji (JP)

(73) Assignees: Sakai Chemical Industry Co., Ltd., Osaka (JP); TOHOKU University, Miyagi (JP); Fuji Ceramics Corporation, Shizuoka (JP)

(*) Notice: Subject to any disclaimer, the term of this patent is extended or adjusted under 35 U.S.C. 154(b) by 277 days.

(21) Appl. No.: 13/262,770
(22) PCT Filed: Apr. 5, 2010
(86) PCT No.: PCT/JP2010/056171
  § 371 (c)(1),
  (2), (4) Date: Nov. 22, 2011
(87) PCT Pub. No.: WO2010/116972
  PCT Pub. Date: Oct. 14, 2010

(65) Prior Publication Data
  US 2012/0064344 A1    Mar. 15, 2012

(30) Foreign Application Priority Data
  Apr. 9, 2009    (JP) ................. 2009-095013

(51) Int. Cl.
  C01B 13/36    (2006.01)
  C01G 1/02     (2006.01)
  C01D 13/00    (2006.01)
  C01D 1/02     (2006.01)
  C01G 33/00    (2006.01)

(52) U.S. Cl.
  CPC C01G 1/02 (2013.01); C01G 33/00 (2013.01); C01D 1/02 (2013.01); C01D 13/00 (2013.01)

USPC ......... 423/65; 423/179; 423/184; 423/593.1; 423/594.8; 423/594.15; 423/594.17; 423/641

(58) Field of Classification Search
  CPC ............ C01D 1/02; C01D 13/00; C01G 1/02; C01G 33/00
  USPC ............... 423/62, 65, 179, 184, 593.1, 594.8, 423/594.15, 594.17, 641
  See application file for complete search history.

(56) References Cited

U.S. PATENT DOCUMENTS 3,366,510 A * 1/1968 Daendliker ............... 427/226
7,585,474 B2 * 9/2009 Wong et al. .................. 423/1

FOREIGN PATENT DOCUMENTS

CN        1101634        4/1995
CN        101249985      8/2008

(Continued)

OTHER PUBLICATIONS

Amini and Mirzaee, Effect of solvent and temperature on the preparation of potassium niobate by hydrothermal-assisted sol-gel processing, Ceramics International, 35 (2009) 2367-2372.*

(Continued)

*Primary Examiner* — Holly Le
(74) *Attorney, Agent, or Firm* — Hamre, Schumann, Mueller & Larson, P.C.

(57) ABSTRACT

Disclosed are a method of producing fine particulate alkali metal niobate in a liquid phase system, wherein the size and shape of the particulate alkali metal niobate can be controlled; and fine particulate alkali metal niobate having a controlled shape and size. One of specifically disclosed is a method of producing a substantially rectangular cuboid particulate alkali metal niobate represented by $MNbO_3$ (1), wherein M represents one element selected from alkaline metals, including specific four steps. Another one of specifically disclosed is particulate alkali metal niobate represented by the formula (1) having a substantially rectangular cuboid shape, wherein the substantially rectangular cuboid shape has a longest side and a shortest side, the length of the longest side represented by an index $L_{max}$ is 0.10 to 25 μm, and the length of the shortest side represented by an index $L_{min}$ is 0.050 to 15 μm.

4 Claims, 5 Drawing Sheets

(56) References Cited

FOREIGN PATENT DOCUMENTS

| | | |
|---|---|---|
| JP | 60-052098 | 3/1985 |
| JP | 2000-313664 | 11/2000 |
| JP | 2006-306678 | 11/2006 |

OTHER PUBLICATIONS

Wang, et al., "Hydrothermal synthesis of potassium niobate powders", Ceramics International, 2007, vol. 33, No. 7, pp. 1611-1615.

Sun, et al., "Hydrothermal Synthesis of Single Crystalline (K, Na)NbO$_3$ Powders", Eur. J. Inorg. Chem., 2007, pp. 1884-1888.

Saito, et al., "Synthesis of polycrystalline platelike KNbO$_3$ particles by the topochemical micro-crystal conversion method and fabrication of grain-oriented (K$_{0.5}$Na$_{0.5}$)NbO$_3$ ceramics", Journal of the European Ceramic Society 27, 2007, pp. 4085-4092.

\* cited by examiner

METHOD FOR PRODUCING ALKALI METAL NIOBATE PARTICLES, AND ALKALI METAL NIOBATE PARTICLES

TECHNICAL FIELD

The present invention relates to a method of producing particulate alkali metal niobate, and particulate alkali metal niobate.

BACKGROUND OF THE INVENTION

Piezoelectric ceramics have significantly contributed to downsizing and sophistication of electronic devices. In addition to applications to conventional devices such as sensors or ultrasonic transducers, piezoelectric ceramics are recently used, for example, as a raw material of transformers for LCD backlights of personal computers or a raw material of head parts of ink jet printers.

Lead-based materials such as PZT-based materials prevail nowadays as such piezoelectric ceramic devices. However, lead-based materials contain large amounts of harmful lead oxide, and thus, for example, environmental pollution by spilled lead oxide on disposal has been a matter of concern. Therefore, development has been strongly demanded for lead-free piezoelectric ceramic materials which can be used for alternatives to conventional lead based materials.

Recently, alkali niobate piezoelectric ceramics draw attention as lead-free ceramic materials, which exhibit relatively high piezoelectricity. Patent Document 1, for example, proposes a piezoelectric ceramic including a solid solution mainly composed of lithium sodium niobate, together with minor components as aluminum oxide and iron oxide. Patent Document 2 proposes an improved composition for a piezoelectric ceramic, which includes potassium niobate and sodium niobate, as main components, and copper, lithium, and tantalum, as additional components.

As a method of producing such piezoelectric ceramics, a method called a solid phase method has been widely known. The solid phase method typically includes mechanically mixing or kneading plural kinds of particulate materials as raw materials, then pelletizing, and calcining the obtained pellets.

In recent years, liquid phase methods of synthesizing $NaNbO_3$ particles have also been studied. For example, Non-Patent Document 1 reports a method of synthesizing $NaNbO_3$ particles by reacting NaOH or KOH solution with $Nb_2O_5$ particles.

Another technique has been recently reported on a method for producing particulate $KNbO_3$ by once synthesizing layered $K_4Nb_6O_{17}$ particles, and then heating the particles at a high temperature in a molten salt (Non-Patent Document 2).

REFERENCES

Patent Documents

[Patent Document 1] JP 60-52098 B
[Patent Document 2] JP 2000-313664 A

Non-Patent Document

[Non-Patent Document 1] C. Sun et al., European Journal of Inorganic Chemistry, 2007, 1884
[Non-Patent Document 2] Y. Saito et al., Journal of the European Ceramic Society, 27 (2007) 4085

SUMMARY OF THE INVENTION

Problem to be Solved by the Invention

However, solid phase methods are disadvantageous in that nanoscale uniform mixing of raw material particles is generally difficult because commonly available raw material particles often have a larger size, like about several millimeters to several micrometers. When raw material particles are calcined at a high temperature, the original crystal structure of the raw material changes into perovskite crystal structure. Thus, it is difficult to precisely control crystallite size and grain boundaries in a solid phase method. Control of grain boundaries is especially indispensable for enhancing properties of piezoelectric ceramics because grain boundaries significantly affect some properties such as piezoelectric properties or strength. Therefore, use of a material in which control of grain boundaries are insufficient may lead to problems such as defects of products and deterioration of properties.

Conventional liquid phase methods may cause particle agglomeration. Also, it is generally difficult to control the size and shape of particles in a uniform state by a conventional liquid phase method. For example, particles produced by the method described in Patent Document 1 are given as aggregates, and are not suitable as a material to form piezoelectric devices, for which downsizing has been recently demanded.

The method described in Patent Document 2 also requires some improvement in that control of the particle size is actually impossible or that multi-step synthesis is required.

In view of the current state, there has been a demand for developing a method of producing particulate alkali metal niobate, which is suitable for mass production, can prevent agglomeration of particles, and can control the grain boundaries and particle size. Further, there has been a demand for fine particulate alkali metal niobate having a highly uniform particle size.

Means for Solving the Problem

The present invention has an object to provide a liquid phase method of producing fine particulate alkali metal niobate which can control the size and shape of the fine particulate alkali metal niobate. The present invention has another object to provide fine particulate alkali metal niobate having controlled shape and size, and a lead-free niobium-containing ceramic material having high piezoelectricity.

A first aspect of the present invention relates to a method of producing particulate alkali metal niobate represented by $$MNbO_3 \qquad (1)$$

wherein M represents one element selected from alkaline metals, the particulate alkali metal niobate having a substantially rectangular cuboid shape, the method including the steps of:

(a) mixing a niobium-containing solution with an alkaline solution having a concentration of 0.1 to 30 mol/L, to prepare a suspension;

(b) still standing the suspension at between 80° C. and 150° C. for 12 to 48 hours;

(c) performing solvothermal reaction of the suspension at between 150° C. and 300° C. for 1 to 12 hours; and (d) separating the particulate alkali metal niobate from a reaction mixture.

In a preferred embodiment, M in the formula (1) is Na, and the alkaline solution is NaOH.

In another preferred embodiment, M in the formula (1) is K, and the alkaline solution is KOH.

In another preferred embodiment, the niobium-containing solution includes:
 niobium oxide and/or niobium halide;
 a solvent selected from the group consisting of water, ethylene glycol, and polyethylene glycol; and
 an acid.

A second aspect of the present invention relates to particulate alkali metal niobate represented by the formula (1):

$$MNbO_3 \quad (1)$$

wherein M represents one element selected from alkaline metals, the particulate alkali metal niobate having a substantially rectangular cuboid shape,
 wherein the substantially rectangular cuboid shape has a longest side and a shortest side,
 the length of the longest side represented by an index $L_{max}$ is 0.10 to 25 μm, and
 the length of the shortest side represented by an index $L_{min}$ is 0.050 to 15 μm.

In a preferred embodiment, the ratio of the $L_{max}$ to the $L_{min}$, $L_{max}/L_{min}$, is within the range of 1 to 5.

In another preferred embodiment, M in the formula (1) is Na or K.

In yet another preferred embodiment, the particulate alkali metal niobate is prepared by the above method.

A third aspect of the present invention relates to a piezoelectric ceramic material that comprises the particulate alkali metal niobate.

Effect of the Invention

According to the production method of the present invention, particulate alkali metal niobate, preferably fine particulate NaNbO$_3$ or KNbO$_3$ can be synthesized in a large scale while controlling the size and shape. Resulting particles have a unique shape of substantially rectangular cuboid, more preferably substantially cubic, and the size and shape are well controlled. The method of the present invention is advantageous because the method gives practically favorable submicron to several micrometer particles in a manner suitable for mass production.

In addition, ceramic materials obtained by pelletizing the niobate particles and calcining the resultant pellet is more advantageous than niobium-based piezoelectric ceramic materials obtained by conventional solid phase methods in the following points:

1. Low-temperature calcination is practicable;
2. Excellent piezoelectric properties will be exhibited;
3. Densification of ceramic materials are easily achievable; and
4. Slurry preparation prior to production of layered articles is easy.

MODE FOR CARRYING OUT THE INVENTION

Figure 1:
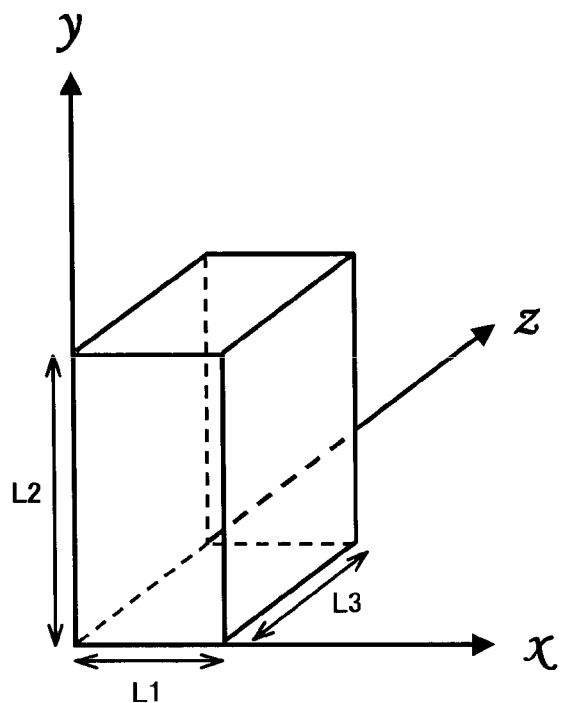
FIG. 1 illustrates a schematic diagram for explaining of the particulate alkali metal niobate of the present invention having a substantially rectangular cuboid shape.

The present invention will be explained in detail below.
<Method of Producing Particulate Alkali Metal Niobate>

As mentioned above, a first aspect of the present invention relates to a method of producing particulate alkali metal niobate represented by the formula:

$$MNbO_3 \quad (1)$$

wherein M represents one element selected from alkaline metals, the particulate alkali metal niobate having a substantially rectangular cuboid shape,
 the method including the steps of:
 (a) mixing a niobium-containing solution with an alkaline solution having a concentration of 0.1 to 30 mol/L, to prepare a suspension;
 (b) still standing the suspension at between 80° C. and 150° C. for 12 to 48 hours;
 (c) performing solvothermal reaction of the suspension at between 150° C. and 300° C. for 1 to 12 hours; and
 (d) separating the particulate alkali metal niobate from a reaction mixture.

In the formula (1), M is an alkaline metal. Specifically, M is an element selected from the group consisting of lithium (Li), sodium (Na), potassium (K), rubidium (Rb), and cesium (Cs). Preferably, M is Li, Na, or K, and more preferably Na or K. In particular, M is preferably K because obtained particles are small in size, and have a highly uniform close-to-cube shape.

In the following, each step is described.

The step (a) is for preparing a suspension by mixing a niobium-containing solution as a niobium source with a high-concentration alkaline solution.

The method to prepare a niobium-containing solution is not particularly limited. For example, such a solution can be prepared by dissolving a niobium compound in an acidic liquid solvent. Preferably, such a niobium compound may be, but not limited to, at least one of niobium oxide and niobium halides. Examples of the niobium halides include niobium fluoride, niobium chloride, niobium bromide, and niobium iodide. In view of handling ability and reactivity, niobium chloride is preferable among the niobium halide. Niobium compounds may be used alone or in combination of two or more of these.

Solvents to be contained in the above acidic liquid solvent are not particularly limited. Examples thereof include water, alcohols such as methyl alcohol and ethyl alcohol, and polyols such as ethylene glycol (EG), glycerol, and polyethylene glycol (PEG). Of these, water, ethylene glycol, and polyethylene glycol, as well as a mixture of these, are preferable in view of relatively high boiling points and applicability to solvothermal reaction. Water is particularly preferable.

The acid to be contained in the above acidic liquid solvent is not particularly limited. Examples thereof include inorganic acids such as hydrochloric acid, sulfuric acid, and nitric acid, and organic acids such as trifluoroacetic acid. Of these, hydrochloric acid and nitric acid are preferable in that they are easily removable after the reaction. Hydrochloric acid is particularly preferable.

Then, the alkaline solution to be used in the step (a) is described.

In the present invention, the alkaline solution is not particularly limited as long as it satisfies required high concentration. However, such an alkaline metal normally a source of the "M" in the particulate alkali metal niobate $MNbO_3$, and thus, specifically, the alkaline metal is preferably an alkali metal hydroxide represented by the following formula (2):

$$MOH \quad (2)$$

wherein M is the same as defined in formula (1). NaOH or KOH is particularly preferred among them.

The solvent contained in the alkaline solution is not particularly limited, and may be water, alcohol, diol, triol, or acetone. Of these, water is preferred.

The alkaline solution to be used in the present invention has such a high concentration as 0.1 to 30 mol/L. The concentration is equivalent to that of a very-high-concentration alkaline solution having a pH of about 13 or higher. That is, assuming that the degree of ionization of a strong base (such as NaOH and KOH) is 1 irrespective of the concentration of the alkaline solution, the pH of a "0.1 mol/L" alkaline solution corresponds to 13, as follows:

$$[OH^-]=1.0\times10^{-1}\,mol/L,$$

$$[H^+][OH^-]=1.0\times10^{-14},$$

and thus, $$[H^+]=1.0\times10^{-13},$$

$$pH=-\log[H^+]=13$$

An alkaline solution having a concentration of less than 0.1 mol/L is undesirable because particles may not grow sufficiently, and thus particles with a desired size and shape may not be produced. In contrast, if the concentration exceeds 30 mol/L, an alkaline solution usually reaches saturation. Thus, the upper limit of the concentration of the alkaline solution herein actually means a saturation concentration of the alkaline solution, and this upper limit may vary depending on the nature of the alkali. The lower limit of the concentration of the alkaline solution is preferably 1 mol/L, and more preferably 2 mol/L. The alkaline solution used herein is a fairly high concentration solution. Therefore, much attention is required to handle the solution. The reaction vessel for step (a) is preferably, but is not limited to, a corrosion-resistant vessel made of, for example, Teflon™.

The niobium-containing solution and the alkali solution prepared separately in the above-mentioned manner are mixed together to prepare a suspension. The way of addition of the solutions is not particularly limited. For example, the niobium-containing solution may be added to the alkaline solution, or the alkaline solution may be added to the niobium-containing solution. In view of safety, it is preferable to slowly add a niobium-containing solution dropwise into the alkaline solution over a sufficient period of time. Temperature and pressure during the mixing are not particularly limited. Usually, the mixing may be carried out at an ordinary temperature (15° C. to 30° C.) under an ordinary pressure (about 1 atm).

Next, the step (b) is described.

The step (b) is a step of heating the suspension at a relatively low temperature over a long period of time. The method of the present invention is characterized by including two steps, namely, a step of heating the suspension at a relatively low temperature over a long period of time, and a step of performing solvothermal reaction at a high temperature for a short period of time. If the step (b) is omitted, aggregates are normally generated, so the particle size cannot be sufficiently controlled. Also, if the step (b) is omitted, particles having a substantially rectangular cuboid shape cannot be produced, which impairs a characteristic of the present invention.

In the step (b), the suspension is heated to a temperature of between 80° C. to 150° C. Keeping this temperature constant for a certain period of time gives a uniform precursor, and encourages the particles to grow into a substantially rectangular cuboid shape. The temperature on heating is preferably 80° C. to 120° C., more preferably 90° C. to 110° C., and still more preferably the boiling point of a solvent. If water is used as the solvent, the suspension is preferably heated to 100° C.

The step (b) is characterized by allowing the suspension to still stand at a specific temperature for 12 to 48 hours. Such still standing step for awhile helps to produce a uniform precursor solution or suspension suitable for particle growth, and promotes growth of particle into a substantially rectangular cuboid shape. If the period for still standing is too short, growth into uniform precursors may be insufficient. In contrast, if the period is too long, the effects may be saturated and the step is not advantageous from an economical viewpoint. Therefore, an appropriate period of still standing is 12 to 48 hours. The period of still standing is preferably 15 to 36 hours, more preferably 18 to 30 hours, and still more preferably 20 to 26 hours.

While the pressure during the step (b) is not particularly limited, the step is usually performed under an ordinary pressure (about 1 atm (=about 0.10 MPa)).

Next, the step (c) is described.

The step (c) is a step of subjecting the suspension which was heated at a relatively low temperature in the step (b) to solvothermal reaction at a high temperature.

The solvothermal reaction is a reaction performed under a moderate to high degree of pressure (normally 1 to 10,000 atm (=0.10 to 1,000 MPa)) and temperature (normally 100° C. to 1,000° C.). When water is used as a solvent, the solvothermal reaction is specially referred to as "hydrothermal reaction". By performing this process, crystal structures and particle shape can be controlled.

In the present invention, the solvothermal reaction is performed at a temperature of between 150° C. and 300° C. While not particularly limited, the temperature is preferably 150° C. to 250° C.

The period of time for the solvothermal reaction is not particularly limited, and is usually 1 to 72 hours, preferably 1 to 8 hours, and more preferably 2 to 5 hours.

The pressure during the solvothermal reaction is not particularly limited, and is usually 0.10 to 4.0 MPa.

Next, the step (d) is described.

The step (d) is a step to separate the particulate alkali metal niobate from the reaction product of the solvothermal reaction.

The method to separate the particulate alkali metal niobate is not particularly limited. Desired particulate alkali metal niobate can be separated through normal processes such as filtration, washing, and drying. The number of times of washing, solvents to be used for washing, and other conditions are not particularly limited, and may be appropriately selected.

<Particulate Alkali Metal Niobate>

Particulate alkali metal niobate, which is a second aspect of the present invention, is described. The particulate alkali metal niobate of the invention is particulate alkali metal niobate represented by the following formula (1):

$$MNbO_3 \quad (1)$$

wherein M represents one element selected from alkaline metals.

The alkali metal niobate have a substantially rectangular cuboid shape. The substantially rectangular cuboid shape has a longest side and a shortest side. Assuming that the length of the longest side is represented by an index $L_{max}$, and the length of the shortest side is represented by an index $L_{min}$, the $L_{max}$ is 0.10 to 25 µm, and the $L_{min}$ is 0.050 to 15 µm.

The M in the above formula (1) is specifically one element selected from lithium (Li), sodium (Na), potassium (K), rubidium (Rb), and cesium (Cs). Li, Na, or K is preferable, and Na or K is more preferable. The M is particularly preferably K because the particles of $KNbO_3$ have a uniform size and shape.

The particulate alkali metal niobate of the present invention is characterized in that the shape of the particles is rectangular cuboid, and their size and shape are highly uniform. The shape of the particulate alkali metal niobate can be controlled in a simple chemical process, and no physical grinding process is necessary. Furthermore, the shape of resulting particles is not a spherical, which is common for particles, but a unique, substantially rectangular cuboid shape. Such features are not expectable from the conventional knowledge.

The particulate alkali metal niobate of the present invention is in a fine, substantially rectangular cuboid shape. Particulate alkali metal niobate obtained by a conventional method is generally in an aggregate form. Therefore, it has been difficult to produce micrometer-order-size particles. The present invention successfully produces micrometer-order-size particles with some advantages such as easy handleability by controlling the shape of particulate alkali metal niobate to be in a substantially rectangular cuboid form, thereby preventing generation of aggregates.

The particles having the shape mentioned above may be packed more densely than sphere particles or aggregated particles. Thus, gap among particles can be reduced on packing the particles. The particulate alkali metal niobate is thus advantageous in that a ceramic material of the present invention made from particulate alkali metal niobate may become dense.

Herein, the term "rectangular cuboid" includes an essentially rectangular cuboid shape and a cube shape. Further, the term "rectangular cuboid" includes a rectangular cuboid shape with partly chipped portions, or a rectangular cuboid shape with uneven surfaces, too.

The rectangular cuboid has an $L_{max}$, the length of the longest side, of 0.10 to 25 µm, and an $L_{min}$, the length of the shortest side, of 0.050 to 15 µm. A rectangular cuboid generally has 12 edges, which are represented as widths, depths, and heights. The particulate alkali metal niobate of the present invention shows particles well-controlled size, and has a substantially rectangular cuboid shape with the length of the longest side of 0.10 to 25 µm and the length of the shortest side of 0.050 to 15 µm.

This feature is further described with reference to the drawings.

FIG. 1 is a schematic diagram of the particulate alkali metal niobate having a rectangular cuboid shape. In FIG. 1, the length of a side along the x-direction is represented as L1, the length of a side along the y-direction is represented as L2, and the length of a side along the z-direction is represented as L3. Here, the lengths satisfy the relation: L1<L3<L2. Thus, the $L_{max}$ corresponds to L2, and the $L_{min}$ corresponds to L1 in FIG. 1. Referring to FIG. 1, the particle of the present invention has the length L2 of within the range of 0.10 to 25 µm, and the length L1 of within the range of 0.050 to 15 µm.

The $L_{max}$ is preferably 0.10 to 20 µm.

The $L_{min}$ is preferably 0.050 to 10 µm, more preferably 0.050 to 4 µm, and further preferably 0.050 to 2 µm. Furthermore, it is particularly preferably 0.050 to 1.5 µm.

In particular, in the case where the alkali metal niobate is potassium niobate, particles with smaller size can be produced. Specifically, rectangular cuboid particles with the length of each side of within about 0.050 to 1.5 µm can be obtained.

Any method can be used to determine the lengths of sides of the particle and the $L_{max}$ and $L_{min}$ of the substantially rectangular cuboid particles, and the method is not particularly limited. The lengths of sides, $L_{max}$ and $L_{min}$ can be determined, for example, in the following manner: Firstly, a microphotographic image of the particulate alkali metal niobate is taken using a scanning electron microscopy (SEM), and then the lengths of sides of each particle are read out from the image.

Also, it is one of the characteristics of the present invention that variation of particle sizes is small over the whole of powdery alkali metal niobate (which is the same meaning as particulate alkali metal niobate). Preferably, at least 80% of the total rectangular cuboid particles in the powder have a length of each side of the rectangular cuboid of within the range of 0.050 to 25 µm. The ratio is more preferably at least 90%, and still more preferably at least 95%.

In a preferred embodiment of the present invention, a ratio $L_{max}/L_{min}$ (the ratio of the length of the longest side to the length of the shortest side in the substantially rectangular cuboid) is within the range of 1 to 5.

Referring to FIG. 1, $L_{max}$ corresponds to L2, and $L_{min}$ corresponds to L1. Thus, the feature "the ratio $L_{max}/L_{min}$ is within the range of 1 to 5" has the same meaning as that the ratio L2/L1 is within the range of 1 to 5 in FIG. 1.

The ratio $L_{max}/L_{min}$ is preferably 1 to 3, more preferably 1 to 2, still more preferably 1 to 1.5, and particularly preferably 1. A state that satisfies the relation, "the ratio $L_{max}/L_{min}$ is 1", means that the shape of a particle is cubic.

The method of preparing particulate alkali metal niobate is not particularly limited. The method described above, which is a first aspect of the present invention, is preferable as the method of preparing the particulate alkali metal niobate. The method is innovative in that the particle size can be controlled simply by a chemical process, and no physical processes such as grinding are necessary. Thus, the method is advantageous in that production processes can be simplified as compared to conventional methods. In addition, the method according to a first aspect of the present invention can control the size of particles, and prevent agglomeration of the particles, while it is generally difficult to control variation in particle size in physical grinding or the like conventional method. As a result, particles with highly-controlled size can be obtained by the method according to a first aspect of the present invention. Because of these reasons, the method of a first aspect of the present invention is preferable as a method for preparing particulate alkali metal niobate.

<Piezoelectric Ceramic Materials>

A third aspect of the present invention relates to a piezoelectric ceramic material including the particulate alkali metal niobate.

A method to produce the piezoelectric ceramic material is not particularly limited. Generally, the piezoelectric ceramic material may be produced by mixing dried particulate alkali metal niobate with required additives such as an organic binder, a dispersant, a plasticizer, and a solvent, to prepare a composition. Then, an article is molded from the composition through a known molding method, and the article is sintered at a high temperature (about 1,000° C.). Examples of such a known molding method include press molding or molding using a mold.

Then, by forming electrodes on a molded body obtained from the piezoelectric ceramic material, piezoelectric elements such as a piezoelectric buzzer and a piezoelectric transducer can be produced.

EXAMPLES

The present invention will be described in more detail based on the following examples. It is to be noted that the present invention is not limited to these examples. In the examples and comparative examples below, the unit "M", which is used to refer to a concentration of an alkali or acid solution, means mol/L unless otherwise indicated.

Example 1

Synthesis 1 of Substantially Cubic $NaNbO_3$ Particles

Figure 2:
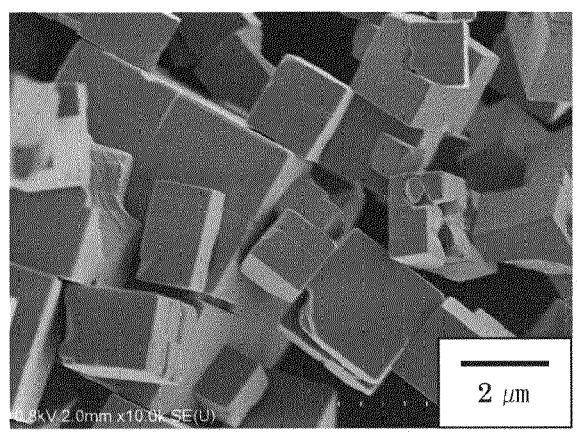
FIG. 2 shows a SEM image of particulate NaNbO$_3$ synthesized in Example 1.
Figure 3:
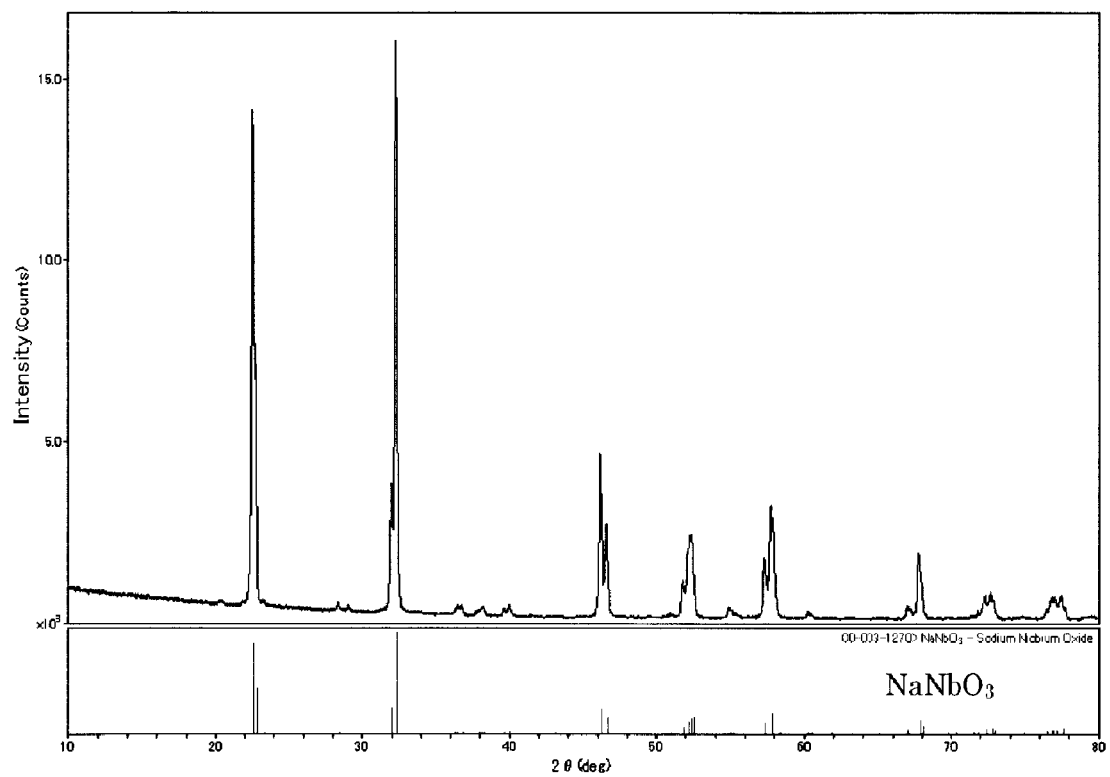
FIG. 3 shows XRD (X-ray diffraction) pattern of the particulate NaNbO$_3$ synthesized in Example 1.

A portion of 27.02 g (=100 mmol) of niobium chloride was completely dissolved in 150 mL of a 0.10-M aqueous HCl solution. The solution was transferred into a 200-mL volumetric flask, and a 0.10-M aqueous HCl solution was further added to the flask for adjusting the total volume of the solution to be 200 mL. A 0.50-M aqueous $NbCl_5$ solution in 0.10 M HCl was thus prepared. Then, 6.0 mL of the 0.50-M aqueous $NbCl_5$ solution in 0.10 M HCl was slowly added to 6.0 mL of a 12.0-M aqueous NaOH solution in a 30-mL Teflon™ vessel at room temperature under stirring. The resulting white suspension was allowed to still stand with heating at 100° C. in the Teflon™ vessel for 24 hours. Then, the content was transferred to an autoclave whose inner chamber wall was made of Teflon™, and allowed to stand for 3 hours with heating at 250° C. The solid matter was separated from the resulting suspension by centrifugation, and then the solid was dispersed in water under ultrasonic dispersing. The solid matter was separated again by centrifugation and dried to separate particulate sodium niobate. The size and shape of the obtained solid particles were observed by a scanning electron microscope (SEM, manufactured by HITACHI, Ltd., S-4800), and the crystal structure of the solid particles was evaluated by X-ray diffraction (XRD, manufactured by Rigaku Corporation, Ultima-IV, 40 kV, 40 mA). FIGS. 2 and 3 show a SEM image and an XRD pattern of the obtained $NaNbO_3$ particles, respectively. Results of the evaluation found that the particles were cubic particles having the length of one side of about 2 μm, and that particles consisted of single phase $NaNbO_3$. Alternatively, the particles can be obtained when the temperature during the second heating step is set to 200° C. By adjusting the initial NaOH concentration to 2 to 18 mol/L, the particle size may be controlled such that the length of the longest side should fall within the range of 0.10 to 25 μm, and the length of the shortest side should fall within the range of 0.050 to 15 μm.

Example 2

Synthesis 1 of Substantially Cubic $KNbO_3$ Particles

Figure 4:
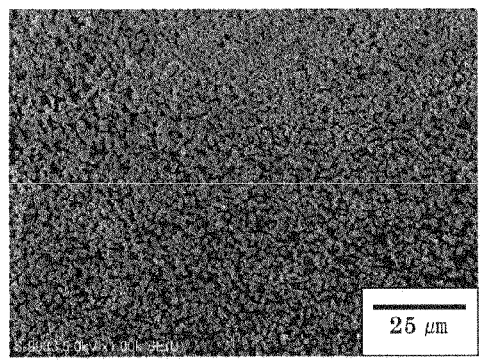
FIG. 4 shows a SEM image of particulate KNbO$_3$ synthesized in Example 2.
Figure 5:
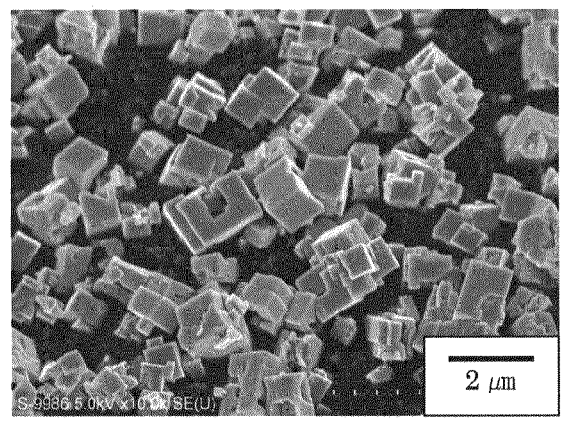
FIG. 5 shows a SEM image of particulate KNbO$_3$ synthesized in Example 2 (Magnified image of the FIG. 4).
Figure 6:
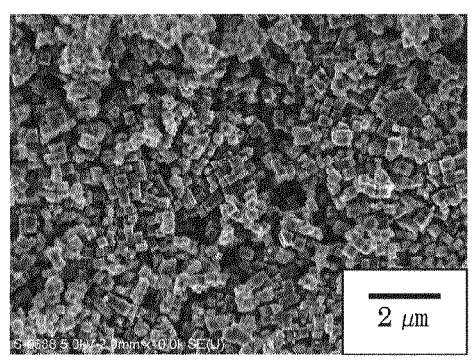
FIG. 6 shows a SEM image of fine particulate KNbO$_3$ synthesized in Example 2 (temperature at secondary heating: 150° C.).

Synthesis of substantially cubic $KNbO_3$ particles was performed in the same manner as in Example 1, except that an 18.0-M aqueous KOH solution was used in place of the 12.0-M aqueous NaOH solution. FIGS. 4 and 5 show the SEM images of the obtained $KNbO_3$ particles. As shown in the SEM images, cubic particles having sides of about 1 μm was obtained. Also, XRD analysis of the cubic particle was carried out, and the analysis found that particles consisted of single phase $KNbO_3$. Alternatively, when the temperature during the second heating step (step (C)) was set to 150° C., cubic $KNbO_3$ particles with a narrow particle size distribution of about 0.2 μm, as shown in FIG. 6, were obtained, although product yield was slightly lowered.

Example 3

Synthesis 2 of Substantially Cubic $NaNbO_3$ Particles

A portion of 6.0 mL of an 8.0-M aqueous NaOH solution was added to 0.40 g (=3.0 mmol) of niobium pentoxide in a 30-mL Teflon™ vessel. Ion-exchange water was further added to the vessel under stirring to adjust the total volume of the mixture to 12 mL. Then, the Teflon™ vessel was sealed and allowed to still stand with heating at 100° C. for 24 hours. Then, the content was transferred to an autoclave whose inner chamber wall was made of Teflon™, and allowed to stand for 3 hours with heating at 250° C. The solid matter was separated from the resulting suspension by centrifugation, and then the solid was dispersed in water under ultrasonic dispersing. The solid matter was separated again by centrifugation and dried to separate $NaNbO_3$ particles. Evaluation of the obtained particles was performed in the same manner as that described in Example 1. By adjusting the initial concentration of NaOH to 5 to 18 mol/L, the size of the substantially rectangular cuboid particles may be controlled such that the lengths of the sides should fall within the range of 0.50 to 25 μm.

Example 4

Synthesis 2 of Substantially Cubic $KNbO_3$ Particles

Figure 7:
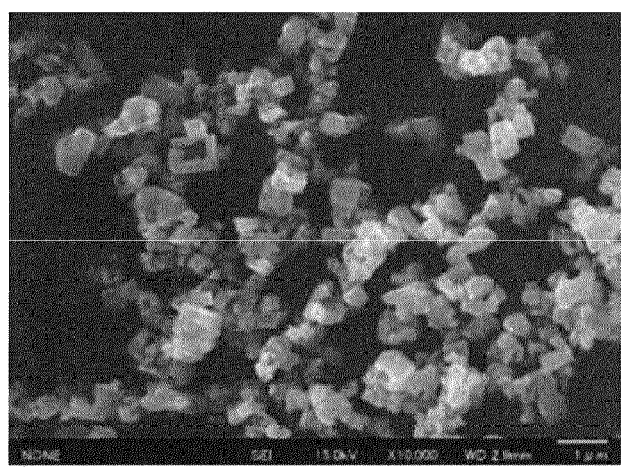
FIG. 7 shows a SEM image of particulate KNbO$_3$ synthesized in Example 4 (starting material: niobium oxide).

Synthesis of substantially cubic $KNbO_3$ particles using niobium pentoxide as a starting material was performed in the same heating procedures and washing operation as those in Example 3, except that a KOH solution or particulate KOH was added in place of the aqueous NaOH solution to control the alkaline ion concentration to 18 M. FIG. 7 shows a SEM image of the obtained $KNbO_3$ particles. The image shows that the particles had a cuboid shape with the lengths of the sides of about 0.5 μm. Moreover, the XRD analysis of the obtained particles found that the articles were $KNbO_3$ particles having an orthorhombic crystal structure.

Example 5

Synthesis 3 of Substantially Cubic $NaNbO_3$ Particles

Figure 8:
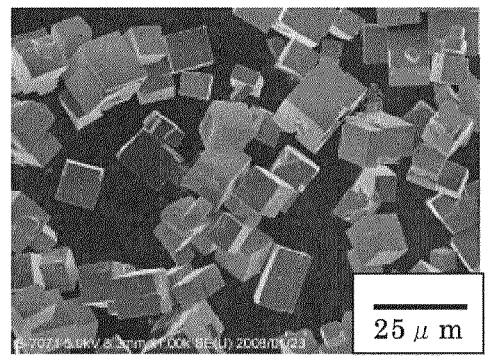
FIG. 8 shows a SEM image of particulate NaNbO$_3$ prepared in Example 5 (heated at 100° C.).

A portion of 6.0 mL of the 0.50-M aqueous $NbCl_5$ solution in 0.10 M HCl was added to 6.0 mL of a 8.0-M NaOH solution under stirring to prepare a white suspension. The white suspension was allowed to still stand with heating at 100° C. for 24 hours in a Teflon™ vessel. The content was transferred to an autoclave whose inner chamber wall was made of Teflon™, and allowed to stand for 3 hours with heating at 250° C. Then, the solid matter was separated from the resulting suspension by centrifugation, and then the solid was dispersed in water under ultrasonic dispersing. The solid matter was separated again by centrifugation and dried to separate particulate sodium niobate. The size and shape of the obtained solid particles were observed by a scanning electron microscope, and the crystal structure of the solid particles was evaluated by X-ray diffraction. FIG. 8 shows the SEM image of the obtained NaNbO$_3$ particles.

Comparative Example 1

Figure 9:
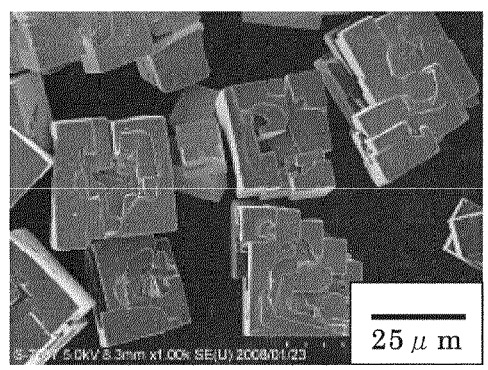
FIG. 9 shows a SEM image of particulate NaNbO$_3$ prepared in Comparative Example 1 (not heated at 100° C.).

Synthesis of Substantially Cubic NaNbO$_3$ Particles, in which the First Heating Step was Omitted Particulate sodium niobate was obtained in the same manner as in Example 5, except that the step of allowing to still stand with heating at 100° C. for 24 hours was omitted. The size and shape of the obtained solid particles were observed by a scanning electron microscope, and the crystal structure of the solid particles was evaluated by X-ray diffraction. FIG. 9 shows the SEM image of the obtained particles.

Comparison of Example 5 with Comparative Example 1 found that the pre-heating treatment at 100° C. contributed to produce uniform-size substantially cubic NaNbO$_3$ particles while preventing agglomeration. According to the result of the XRD analysis, both of the particles shown in FIGS. 8 and 9 consisted of single phase NaNbO$_3$.

Example 6

Synthesis of Substantially Cubic KNbO$_3$ Particles

Figure 10:
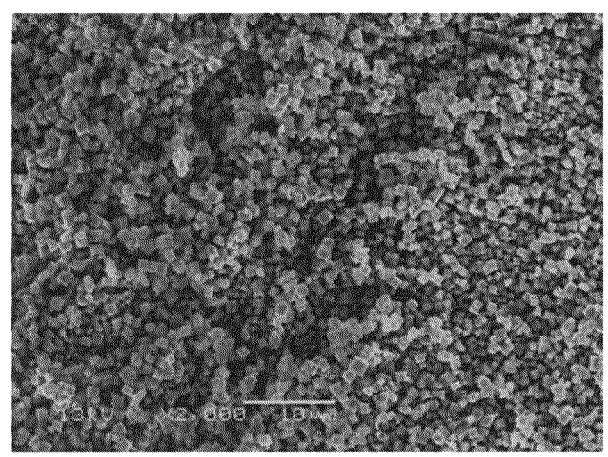
FIG. 10 shows a SEM image of particulate KNbO$_3$ synthesized in Example 6 (large scale synthesis).
Figure 11:
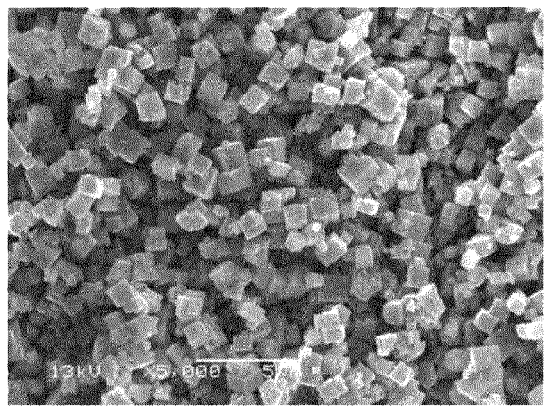
FIG. 11 shows a SEM image of particulate KNbO$_3$ synthesized in Example 6 (Magnified image of the FIG. 10).
Figure 12:
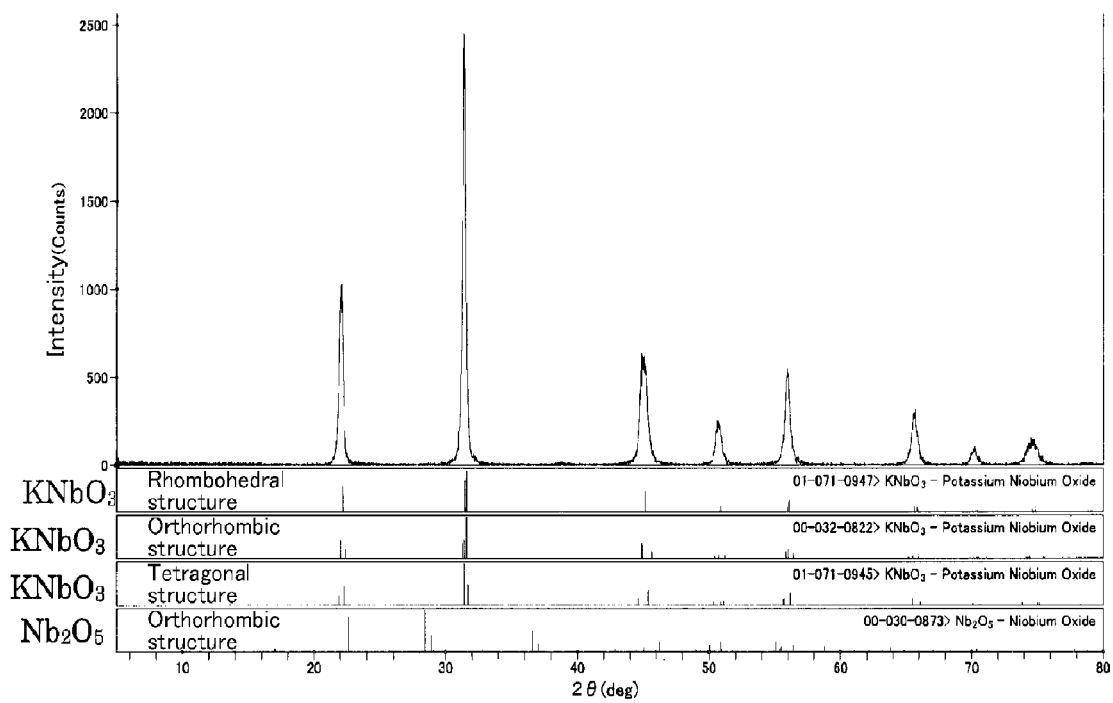
FIG. 12 shows an XRD pattern of particulate KNbO$_3$ synthesized in Example 6 (large scale synthesis).

To an alkaline solution (36 M KOH solution, 185 mL) put in a Teflon™ vessel, 185 mL of an dispersion containing 12.3 g of Nb$_2$O$_5$ was added dropwise at a rate of 15 mL/min under stirring. The thus-obtained mixed suspension was stirred for 10 minutes in a Teflon™ vessel. The resultant suspension was transferred to an autoclave whose inner chamber wall was made of Teflon™. The suspension was heated up to 100° C. over 30 minutes under stirring, and was then stirred at 100° C. for 24 hours. Next, the suspension was heated up to 200° C. over two and a half hours, followed by heating at 200° C. for three hours under stirring. After the heating, the suspension was naturally cooled. The solid matter was separated from the resulting suspension by centrifugation. Then, the solid matter was dispersed in water under ultrasonic dispersing, separated by centrifugal segmentation, and decantation. This washing process including ultrasonic dispersing, centrifugal segmentation, and decantation was repeated six times. Washing by centrifugation was further made three times using acetone as a washing liquid, followed by drying in a desiccator. Thereby, particulate sodium niobate was obtained. The size and shape of the obtained solid particles were observed by a scanning electron microscope, and the crystal structure of the solid particles was evaluated by X-ray diffraction. FIGS. 10 and 11 show the SEM image of the synthesized particles. FIG. 12 shows the result of the XRD analysis. The particles were in a cubic shape. The diffraction pattern indicated that the obtained particles consisted of KNbO$_3$ rhombohedral crystal.

Example 7

Preparation of KNbO$_3$ Ceramics by Sintering and Evaluation of Piezoelectric Properties The KNbO$_3$ particles prepared in Example 2 were pelletized and then sintered at various different sintering temperatures. The piezoelectric properties of the obtained ceramics were evaluated. Table 1 shows values of the properties.

In Table 1, the "sintering temp." refers to sintering temperatures, the "$\rho$" refers to a sintering density, which was calculated based on the size (volume) and weight of the particles. The "tan $\delta$" refers to a dielectric loss measured with an impedance analyzer. Further, the "$\epsilon_{33}^T/\epsilon_0$" refers to a dielectric constant measured with an impedance analyzer. The "Kp" refers to an electromechanical coupling coefficient, which was calculated based on values of resonance frequency and antiresonance frequency measured with an impedance analyzer. The "Np" refers to a frequency constant calculated based on a value of resonance frequency measured with an impedance analyzer and element diameter, and the "d33" refers to a piezoelectric constant measured with a d33 meter.

TABLE 1

| No. | Sintering Temp. ° C. | $\rho$ g/cm$^3$ | tan $\delta$ % | $\epsilon_{33}^T/\epsilon_0$ | $K_p$ % | $N_p$ Hz·mm | d33 pC/N |
|---|---|---|---|---|---|---|---|
| 1 | 1020 | 4.05 | 8.72 | 877 | 25.5 | 3220 | 133.4 |
| 2 | 1040 | 4.07 | 6.77 | 875 | 27.2 | 3297 | 120 |
| 3 | 1060 | 3.76 | 8.68 | 727 | 21.4 | 3000 | 83.7 |

As shown in Table 1, the KNBO$_3$ ceramics obtained in the present invention showed high piezoelectric properties. Especially in the case where the sintering temperature was set to 1,020° C., an high piezoelectric property as d33 of 133.4 was achieved.

INDUSTRIAL APPLICABILITY

The production method of the present invention is a method to provide fine particulate alkali metal niobate directly and simply by a chemical process, which does not need any physical processes such as grinding. According to the method of the present invention, substantially rectangular cuboid particles can be provided by a liquid phase. Agglomeration of the particles can be prevented due to the substantially rectangular cuboid shape, and thereby fine particles with small variation in particle sizes can be produced. The particles thus obtained are micrometer-order-size particles with easy handleability, and such particles can be suitably used as a piezoelectric material.

EXPLANATION OF SYMBOLS

L1: Length of a side along the x-direction
L2: Length of a side along the y-direction
L3: Length of a side along the z-direction

The invention claimed is:
1. A method of producing particulate alkali metal niobate represented by the following formula (1):

$$MNbO_3 \qquad (1)$$

wherein M represents one element selected from alkaline metals, the particulate alkali metal niobate having a substantially rectangular cuboid shape, the method comprising the steps of:
(a) mixing a niobium-containing solution with an alkaline solution having a concentration of 0.1 to 30 mol/L, to prepare a suspension;
(b) allowing the suspension to stand still for 12 to 48 hours at a temperature between 80° C. and 150° C.;
(c) performing a solvothermal reaction of the suspension at a temperature between 150° C. and 300° C. for 1 to 12 hours; and
(d) separating the particulate alkali metal niobate from a reaction mixture.

2. The method according to claim 1, wherein M in the formula (1) is Na, and the alkaline solution is NaOH.

3. The method according to claim 1, wherein M in the formula (1) is K, and the alkaline solution is KOH.

4. The method according to claim 1, wherein the niobium-containing solution includes:
niobium oxide and/or niobium halide;
a solvent selected from the group consisting of water, ethylene glycol, and polyethylene glycol; and
an acid.

\* \* \* \* \*